(12) United States Patent
Dunworth et al.

(10) Patent No.: US 8,339,165 B2
(45) Date of Patent: Dec. 25, 2012

(54) CONFIGURABLE DIGITAL-ANALOG PHASE LOCKED LOOP

(75) Inventors: Jeremy D. Dunworth, San Diego, CA (US); Gary J. Ballantyne, San Diego, CA (US); Bhushan S. Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 82 days.

(21) Appl. No.: 12/632,061

(22) Filed: Dec. 7, 2009

(65) Prior Publication Data

US 2011/0133799 A1 Jun. 9, 2011

(51) Int. Cl.
*H03L 7/00* (2006.01)

(52) U.S. Cl. ........ 327/152; 327/158; 327/159; 375/375; 375/376

(58) Field of Classification Search ................ 327/141, 327/144–163; 331/1 A, 15–17; 375/373–376
See application file for complete search history.

(56) References Cited

U.S. PATENT DOCUMENTS

| | | | |
|---|---|---|---|
| 5,648,964 A | 7/1997 | Inagaki et al. | |
| 5,757,238 A * | 5/1998 | Ferraiolo et al. | ................ 331/16 |
| 5,978,425 A | 11/1999 | Takla | |
| 5,999,060 A | 12/1999 | Zuta | |
| 6,094,101 A | 7/2000 | Sander et al. | |
| 6,114,920 A * | 9/2000 | Moon et al. | ................... 331/179 |
| 6,188,288 B1 | 2/2001 | Ragan et al. | |
| 6,700,447 B1 | 3/2004 | Nilsson | |
| 6,809,598 B1 | 10/2004 | Staszewski et al. | |
| 7,053,727 B2 | 5/2006 | Nilsson | |
| 7,084,713 B2 | 8/2006 | Peluso | |
| 7,116,183 B2 | 10/2006 | Wu | |
| 7,230,504 B1 | 6/2007 | Marques et al. | |
| 7,280,001 B2 | 10/2007 | Maligeorgos et al. | |
| 7,349,514 B2 * | 3/2008 | Meltzer et al. | ................ 375/376 |
| 7,403,750 B2 | 7/2008 | Rosnell et al. | |
| 7,414,557 B2 | 8/2008 | Andersson et al. | |
| 7,443,206 B1 | 10/2008 | Fernandez | |
| 7,443,261 B2 | 10/2008 | Yoshikawa et al. | |
| 7,518,458 B2 | 4/2009 | Nakamura et al. | |

(Continued)

FOREIGN PATENT DOCUMENTS

DE 102006011285 A1 9/2007

(Continued)

OTHER PUBLICATIONS

International Search Report and Written Opinion—PCT/US2010/059338, International Search Authority—European Patent Office—Mar. 3, 2011.

(Continued)

*Primary Examiner* — Lincoln Donovan
*Assistant Examiner* — Brandon s Cole
(74) *Attorney, Agent, or Firm* — Eric Ho

(57) ABSTRACT

A phase locked loop (PLL) device is configurable in an analog phase locked loop and a hybrid analog-digital phase locked loop. In an analog mode, at least a phase detector, an analog loop filter, and a voltage controlled oscillator (VCO), are connected to form an analog loop. In a digital mode, at least the phase detector, the voltage controlled oscillator (VCO), a time to digital converter (TDC), a digital loop filter and a digital to analog converter (DAC) are connected to form the hybrid digital-analog loop.

21 Claims, 11 Drawing Sheets

U.S. PATENT DOCUMENTS

| | | |
|---|---|---|
| 7,535,311 B2 | 5/2009 | Nergis |
| 7,557,623 B2 | 7/2009 | Moehlmann et al. |
| 7,557,624 B2 | 7/2009 | Van Der Valk et al. |
| 7,647,033 B2 | 1/2010 | Uozumi et al. |
| 7,764,127 B2 | 7/2010 | Sun et al. |
| 7,805,122 B2 | 9/2010 | Lerner et al. |
| 7,809,338 B2 | 10/2010 | Tsfati |
| 7,936,221 B2 | 5/2011 | Staszewski et al. |
| 7,999,622 B2 | 8/2011 | Galton et al. |
| 8,022,849 B2 | 9/2011 | Zhang et al. |
| 8,076,960 B2 | 12/2011 | Geng et al. |
| 2004/0192231 A1 | 9/2004 | Grewing et al. |
| 2004/0192369 A1 | 9/2004 | Nilsson |
| 2004/0196924 A1 | 10/2004 | Wilson |
| 2005/0046488 A1 | 3/2005 | Grewing et al. |
| 2005/0286562 A1 | 12/2005 | Nakao et al. |
| 2006/0033587 A1 | 2/2006 | Cabanillas |
| 2006/0171495 A1 | 8/2006 | Youssouflan |
| 2006/0238261 A1 | 10/2006 | Rhee et al. |
| 2007/0036238 A1 | 2/2007 | Matero et al. |
| 2007/0085579 A1 | 4/2007 | Wallberg et al. |
| 2007/0152857 A1 | 7/2007 | Tu et al. |
| 2007/0165743 A1 | 7/2007 | McCallister |
| 2007/0195917 A1 | 8/2007 | Landmark |
| 2008/0069286 A1 | 3/2008 | Staszewski et al. |
| 2008/0122504 A1 | 5/2008 | Van Der Valk et al. |
| 2008/0205571 A1 | 8/2008 | Muhammad et al. |
| 2009/0010372 A1 | 1/2009 | Maeda |
| 2009/0015338 A1 | 1/2009 | Frey |
| 2009/0045993 A1 | 2/2009 | Tokumaru et al. |
| 2009/0102564 A1 | 4/2009 | Ballantyne |
| 2009/0102570 A1 | 4/2009 | Yoshida et al. |
| 2009/0108891 A1 | 4/2009 | Sander et al. |
| 2009/0153254 A1 | 6/2009 | Yu et al. |
| 2009/0175399 A1* | 7/2009 | Sun et al. ............... 375/376 |
| 2009/0207961 A1* | 8/2009 | Sai ............... 375/375 |
| 2009/0262877 A1 | 10/2009 | Shi et al. |
| 2009/0262878 A1* | 10/2009 | Sun et al. ............... 375/376 |
| 2009/0267664 A1* | 10/2009 | Uozumi et al. ............... 327/158 |
| 2009/0322439 A1 | 12/2009 | Mayer et al. |
| 2010/0066421 A1 | 3/2010 | Geng et al. |
| 2010/0097108 A1* | 4/2010 | Sugibayashi et al. ......... 327/141 |
| 2010/0135368 A1 | 6/2010 | Mehta et al. |
| 2010/0141314 A1* | 6/2010 | Chen ............... 327/159 |
| 2010/0195779 A1* | 8/2010 | Sai ............... 375/376 |
| 2010/0245160 A1 | 9/2010 | Sakurai et al. |
| 2011/0133794 A1 | 6/2011 | Dunworth et al. |

FOREIGN PATENT DOCUMENTS

| | | |
|---|---|---|
| EP | 0899866 A1 | 3/1999 |
| WO | WO0152401 A1 | 7/2001 |
| WO | WO2004068697 A1 | 8/2004 |
| WO | WO2008005853 | 1/2008 |

OTHER PUBLICATIONS

Sander et al., "Polar Modulator for Multi-mode Cell Phones," IEEE 2003 Custom Integrated Circuits Conference, pp. 439-445, Cupertino, CA, USA.

Staszewski et al., "Digital RF Processor (DRPtm) for Cellular Phones," 2005 IEEE, pp. 122-129, Dallax, TX, USA.

Pamarti et al., "A Wideband 2.4-GHz Delta-Sigma Fractional-N PLL With 1-Mb/s In-Loop Modulation," IEEE Journal of Solid-State Circuits, vol. 39, No. 1, pp. 49-62, Sep. 24, 2003, San Diego, CA, USA.

Deveugele et al., "A 10b 250MS/s Binary-Weighted Current-Steering DAC," 2004 IEEE Solid-State Circuits Conference, Feb. 18, 2004, Belgium.

Lau et al., "Fractional-N Frequency Synthesizer Design at the Transfer Function Level Using a Direct Closed-Loop Realization Algorithm," Design Automation Conference 2003, pp. 526-531, Jun. 2-6, 2003, Anaheim, California, USA.

Keese, "An Analysis and Performance Evaluation of a Passive Filter Design Technique for Charge Pump Phase-Locked Loops," National Semiconductor Application Note 1001, pp. 1-8, May 2006.

Si et al., "A Single-Chip CMOS Bluetooth v2.1 Radio SoC," IEEE Journal of Solid-State Circuits, vol. 43, No. 12, pp. 2896-2904, Dec. 10, 2008, Santa Clara, CA, USA.

Volodymyr Kratyuk et al: "A Design Procedure for All—Digital Phase-Locked Loops Based on a Charge-Pump Phase-Locked-Loop Analogy "IEEE Transactions on Circuits and Systems 11: Express Briefs, IEEE Service Center, New York, NY, US LNKDD01:10. 1109/TCSII .2006.889443, vol. 54, No. 3, Mar. 1, 2007, pp. 247-251, XP011175096 ISSN: 1057-7130.

* cited by examiner

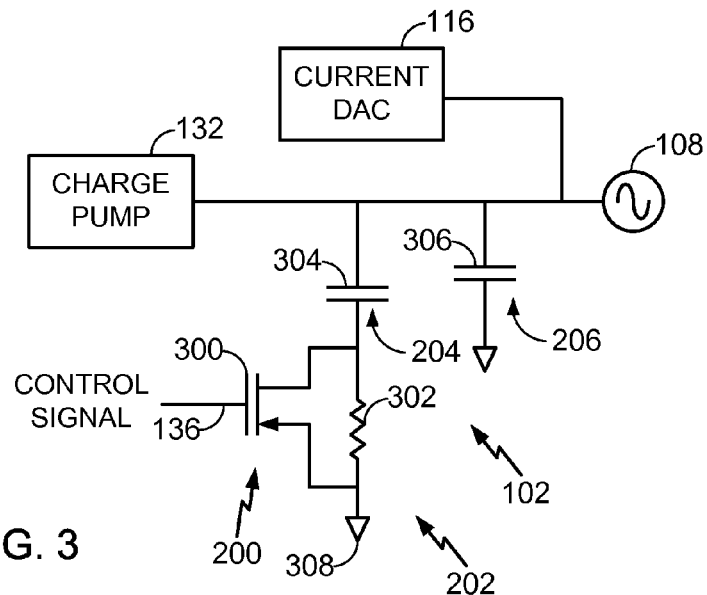
FIG. 3
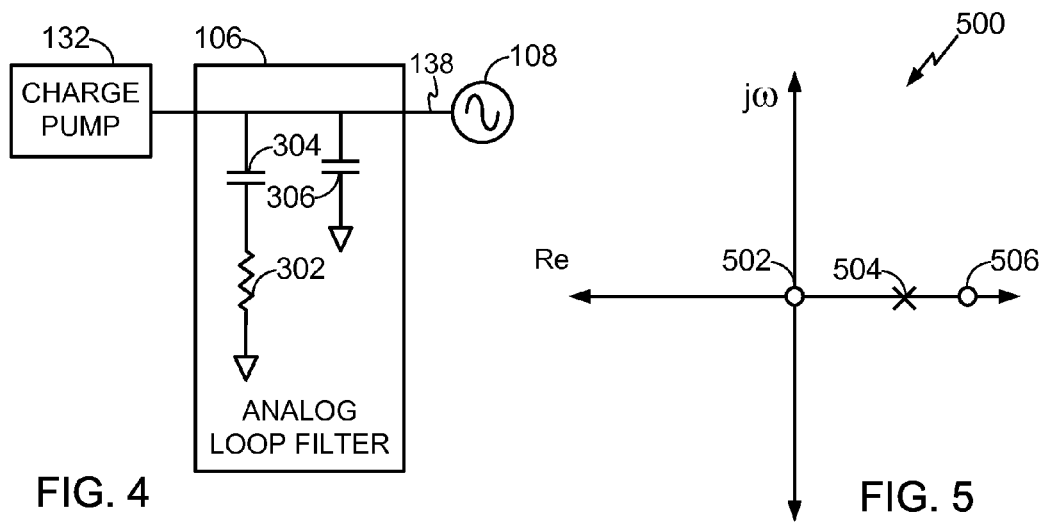
FIG. 4
FIG. 5
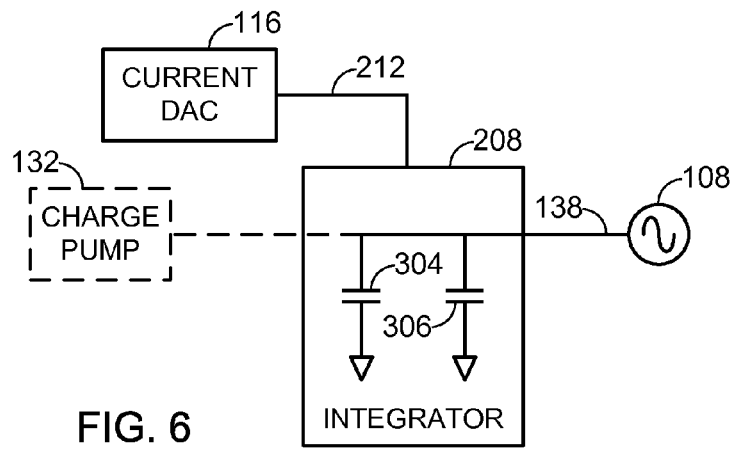
FIG. 6

CONFIGURABLE DIGITAL-ANALOG PHASE LOCKED LOOP

REFERENCE TO CO-PENDING APPLICATIONS FOR PATENT

The present application for patent is related to the following co-pending U.S. Patent Application entitled, "PHASE LOCKED LOOP WITH DIGITAL COMPENSATION FOR ANALOG INTEGRATION", filed concurrently herewith, assigned to the assignee hereof, and expressly incorporated by reference herein.

BACKGROUND

1. Field

The present invention relates generally to phase locked loops, and more specifically to hybrid analog-digital phase locked loops.

2. Background

Phase-locked loops (PLLs) generate signals relative to a reference signal. The phase-locked loop circuit adjusts a frequency of a PLL output signal based on differences in phase and/or frequency of the reference signal and the output signal. The frequency of the output signal is increased or decreased based on the difference. The phase-locked loop is, therefore, a control system using negative feedback. Phase-locked loops are used in electronics such as radios, telecommunication circuits, and computers as well as other devices.

PLLs often use a resonant-tuned voltage controlled oscillator (VCO) to generate the PLL output signal. A resonant tuned VCO often includes a capacitive device and a resonant inductor-capacitor (LC) circuit. The capacitive device typically includes at least one varactor having a capacitance that responds to a tuning voltage to change the frequency of the PLL output signal.

Some conventional PLL include one more digital components. Such PLLs have advantages over analog loops in some respects. Unfortunately, these PLLs also have some disadvantages. Accordingly, there is need for a PLL that has advantages of both analog and digital loops

SUMMARY

A phase locked loop (PLL) device is configurable in an analog phase locked loop and a hybrid analog-digital phase locked loop. In an analog mode, at least a phase detector, an analog loop filter, and a voltage controlled oscillator (VCO), are connected to form an analog loop. In a digital mode, at least the phase detector, the voltage controlled oscillator (VCO), a time to digital converter (TDC), a digital loop filter and a digital to analog converter (DAC) are connected to form the hybrid digital-analog loop.

BRIEF DESCRIPTION OF THE DRAWINGS

FIG. 3 is schematic illustration of a switching mechanism connected to the charge pump and the current DAC where the switching element is a transistor.

FIG. 4 is a schematic diagram of the analog loop filter formed when the switching mechanism is in the analog mode.

FIG. 5 is a graphical representation of the filter response of the exemplary loop filter in a complex plane.

FIG. 6 is a schematic diagram of the integrator formed when the switching mechanism is in the digital mode.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
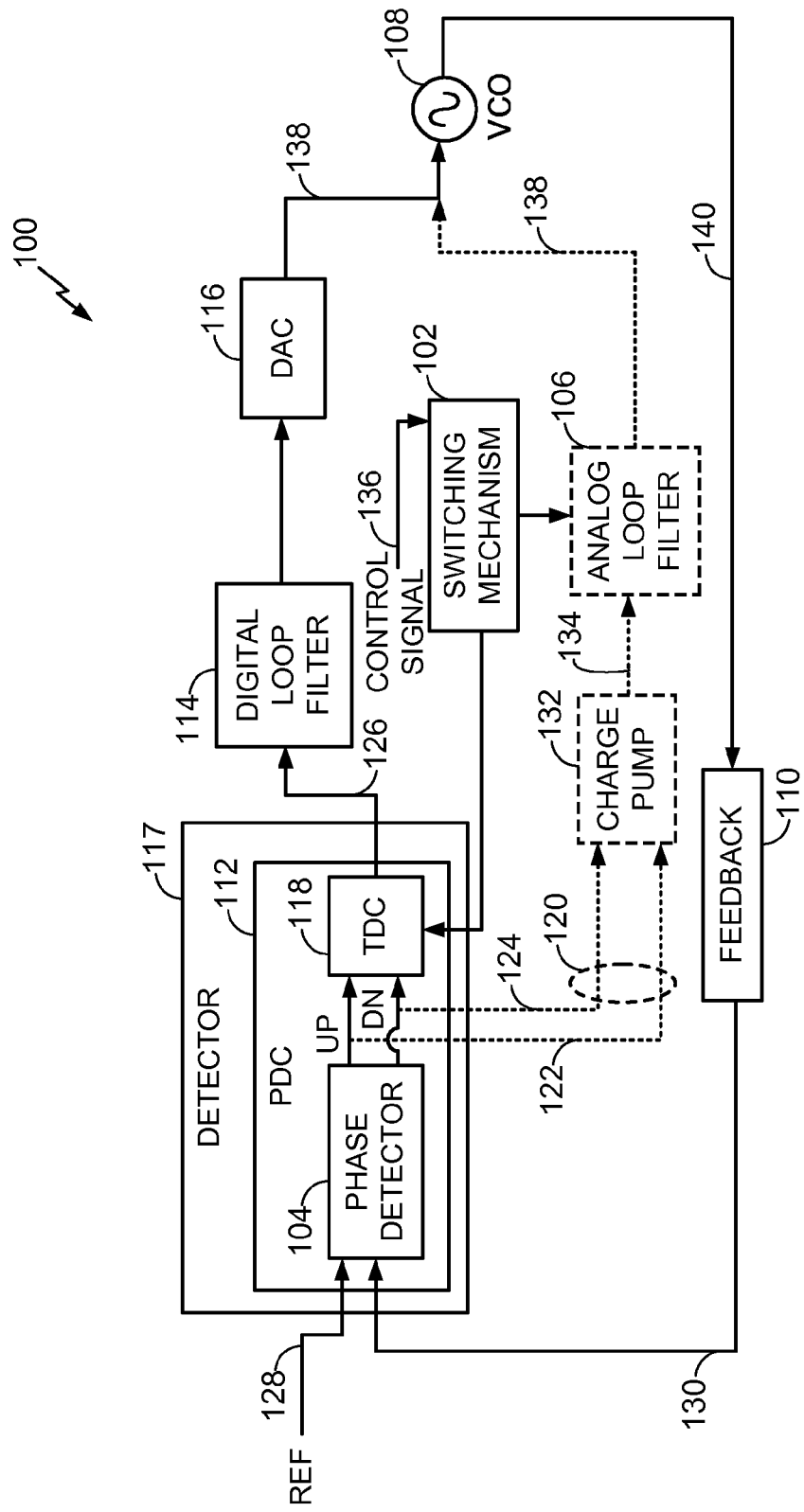
FIG. 1 is a block diagram of a hybrid analog-digital phase locked loop device (PLL device) in accordance with an exemplary embodiment of the invention.

FIG. 1 is a block diagram of a configurable analog-digital phase locked loop device (PLL device) 100 in accordance with an exemplary embodiment of the invention. The functional blocks discussed with reference to FIG. 1 may be implemented using any suitable combination of devices, circuits and/or code. Accordingly, the functions of the blocks may be implemented in hardware, software and/or firmware. The functions of several blocks may be performed by a single circuit or device and functions described as performed by a single block may be performed by several devices or circuits.

The PLL device includes a switching mechanism 102 that configures the PLL device 100 into an analog PLL or into a hybrid digital-analog PLL that includes digital as well as analog signals and components. When in an analog mode, the PLL device 100 is configured in the PLL loop that includes at least a phase detector 104, analog loop filter 106, voltage controlled oscillator (VCO) 108 and feedback 110. When in a digital mode, the PLL device 100 is configured in the hybrid digital-analog loop to include at least a phase to digital converter (PDC) 112, a digital loop filter 114, a digital to analog converter (DAC) 116, the VCO 108 and the feedback 110. In the exemplary embodiment, a detector 117 includes the phase detector 104 and the PDC 112 where the PDC 112 is formed by the phase detector 104 and a time to digital converter (TDC) 118. The detector 117, therefore, is configured as a digital detector in the digital mode and as an analog detector in the analog mode. The correction signal 120 generated by the detector 117 is an analog signal including an up signal 122 and a down signal 124 in the analog mode. During the digital mode, a digital correction signal 126 is provided by the detector 112. In the exemplary embodiment, the analog up and down signals 122, 124 of the analog correction signal 120 is converted to a digital number by the TDC 118 to form the digital correction signal 126. Other methods can be used by the detector 117 to provide a digital correction signal 126 in some circumstances.

The phase detector 104 generates the up signal 122 and the down signal 124 in accordance with the phase difference between a reference signal 128 and feedback signal 130 provided by the feedback 108. A charge pump 132 generates an analog loop signal 134 based on the up and down signals 122, 124 when the PLL device 100 is in the analog mode. The charge pump 132 and the analog loop filter 106 are illustrated with blocks having dashed lines to indicate that these blocks are not used in the digital mode. In the analog mode, the TDC 118, digital filter 114, and DAC 116 are not used.

The switching mechanism 102 is responsive to a control signal 136 to configure the PLL device 100 into either the partially digital loop (hybrid digital-analog loop) or the analog loop. The switching mechanism 102 includes at least one switching element that enables a loop path through the analog loop filter 106 during the analog mode and enables a loop path including the digital loop filter 114 and DAC 116 during the digital mode. The control signal 136 may be single signal that changes values or the control signal may include multiple signals. In the exemplary embodiment, the switching mechanism 102 powers down, disconnects, and/or otherwise disables the TDC 118 and/or DAC 116 in the analog mode. An example of a suitable technique for disabling the DAC 116 includes withdrawing or otherwise switching off the current reference signal (IREF discussed below in FIG. 13, FIG. 14 and FIG. 15) and set transistors and switches to an open or high impedance state. In some circumstances, other components may be disabled or disconnected from power during either the digital or analog mode.

During the analog mode, the phase detector 104 generates the up and down signals 122, 124 which causes the charge pump 132 to generate the analog loop signal 134. The analog loop filter 106 filters the analog loop signal 134 to provide a VCO control signal 138 to the VCO 108. The VCO control signal 138 adjusts the frequency of a VCO output signal 140. The VCO output signal 140 is fed back to the phase detector 116 through the feedback 110. The feedback 110 may alter the VCO output signal 140 by dividing, scaling, or otherwise processing the VCO output signal 140 to generate the feedback signal 130. The feedback may have a different configuration in the analog mode from the digital mode depending on the particular circumstances. For example, a divider ratio in the feedback may be changed between modes where the reference frequency changes and/or the VCO operating frequency changes when the PLL is switched from one mode to the other.

Figure 2:
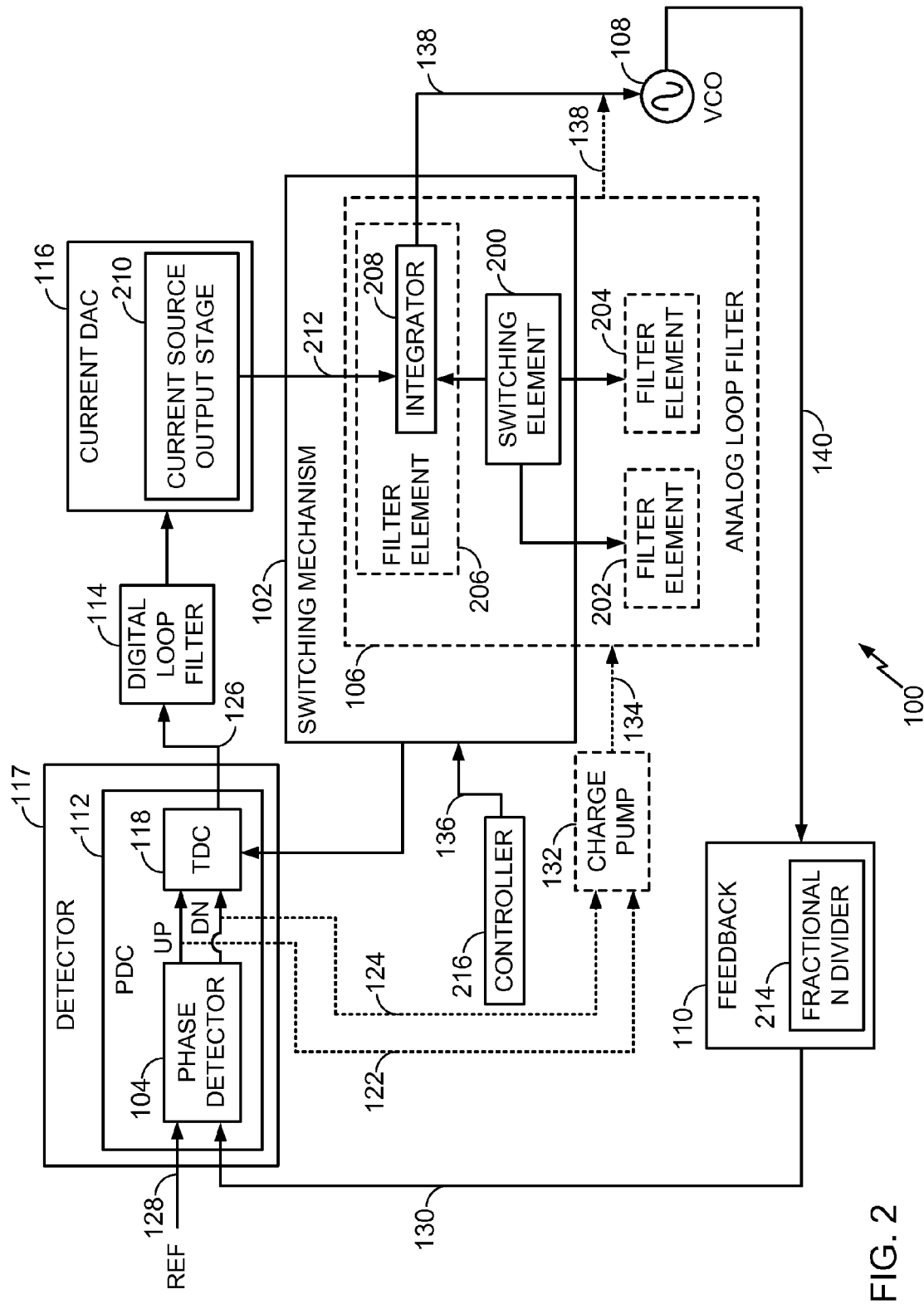
FIG. 2 is a block diagram of the PLL device where the switching mechanism configures filter elements to form an integrator during the digital mode.

FIG. 2 is a block diagram of the PLL device 100 where the switching mechanism 102 includes a switching element 200 that connects filter elements 202, 204, 206 to form an integrator 208 during the digital mode. In this example the DAC 116 is a current DAC that includes a current source output stage 210. Examples of suitable current DACs include current steering DACs and current pulse DACs. The discussion below with reference to FIG. 13, FIG. 14 and FIG. 15 describes examples of current DACs. The current source output stage 210 provides an analog current signal 212. The integrator 208 integrates the current signal 212 to provide a VCO control voltage signal 138 to the VCO 108. The analog loop filter 106 includes at least one filter element 206 that is configured as the integrator 208 during the digital mode. During the analog mode, the filter element 206 is connected to the other filter elements 202, 204 to form the analog loop filter 106. As discussed below, for example, a capacitor forming part of the analog loop filter 106 can be connected to the output of the DAC 116 and to ground to form the integrator 208 during the digital mode.

The analog loop filter 106 has a frequency response selected in accordance with the particular requirements of the PLL device 100 when in the analog mode. An example of a suitable response includes having a first pole at the origin, a zero at a first frequency and a second pole at a second frequency greater than the first frequency when represented by pole-zero plot in a complex plane.

The switching mechanism 102 is responsive to the control signal 136 generated by a controller 216 in the example of FIG. 2. The controller 216 is any combination of hardware, logic and/or code that determines when to configure the PLL into the digital mode and the analog mode and that can generate the control signal 136 having a first value in the digital mode and a second value in the analog mode. As discussed above, the control signal 136 may include multiple signals in some circumstances. Accordingly, the terms "first control signal value" and "second control signal value" at least include two values of a single control signal and values of two different control signals. The controller 216 may be a processor, microprocessor, or processor arrangement that performs the functions of managing the PLL device 100.

FIG. 3 is schematic illustration of a switching mechanism 102 connected to the charge pump 132 and the current DAC 116 where switching element 200 is a transistor 300. The transistor 300 is connected to the filter elements 202, 204, 206 where the filter elements include a resistor 302, a first capacitor 304 and a second capacitor 306. For the example, the transistor 300 is an N-Channel field effect transistor (FET). Other types of transistors can be used in accordance with known techniques. The control signal 136 provides a bias at the gate of the FET 300 where one control signal value causes the FET 300 to from a connection to ground 308 to bypass the resistor 302 and a second control signal value results in a high impedance (i.e. open circuit). The high impedance (open circuit) results in a circuit that includes the first capacitor 304 connected through the resistor 302 to ground 308. Accordingly, one control signal value connects the filter elements to form the analog loop filter 106 and the other control signal value connects the filter elements to form an integrator 208. The two formed circuits are discussed below with reference to FIG. 4 and FIG. 6. In most implementations, the FET series resistance when the control signal provides a bias at the gate of the FET to form a connection to ground is relatively small compared to the resistor and is equal to or smaller than the series resistance inherent in the capacitor.

FIG. 4 is a schematic diagram of the analog loop filter 106 formed when the switching mechanism 102 configures the PLL device 100 in the analog loop. Any number of filter elements and configurations can be used for the analog loop filter 106. In the exemplary embodiment, the analog loop filter 106 includes the two capacitors 304, 306 and the resistor 302 to form a filter response that can be represented in a complex plane as having two poles and a zero.

FIG. 5 is a graphical representation 500 of the filter response of the exemplary loop filter in a complex plane. The filter response includes a first pole 502 at the origin, a zero 504 at a first frequency, and a second pole 506 at a second frequency higher than the first frequency.

FIG. 6 is a schematic diagram of the integrator 208 formed when the switching mechanism 102 configures the PLL device 100 in the hybrid digital-analog loop. The first capacitor 304 and the second capacitor 306 are connected in parallel to provide a parallel capacitance which forms the integrator

208. The capacitors 304, 306 integrate the current signal 212 provided by the current DAC to form the VCO control signal 138.

Figure 7:
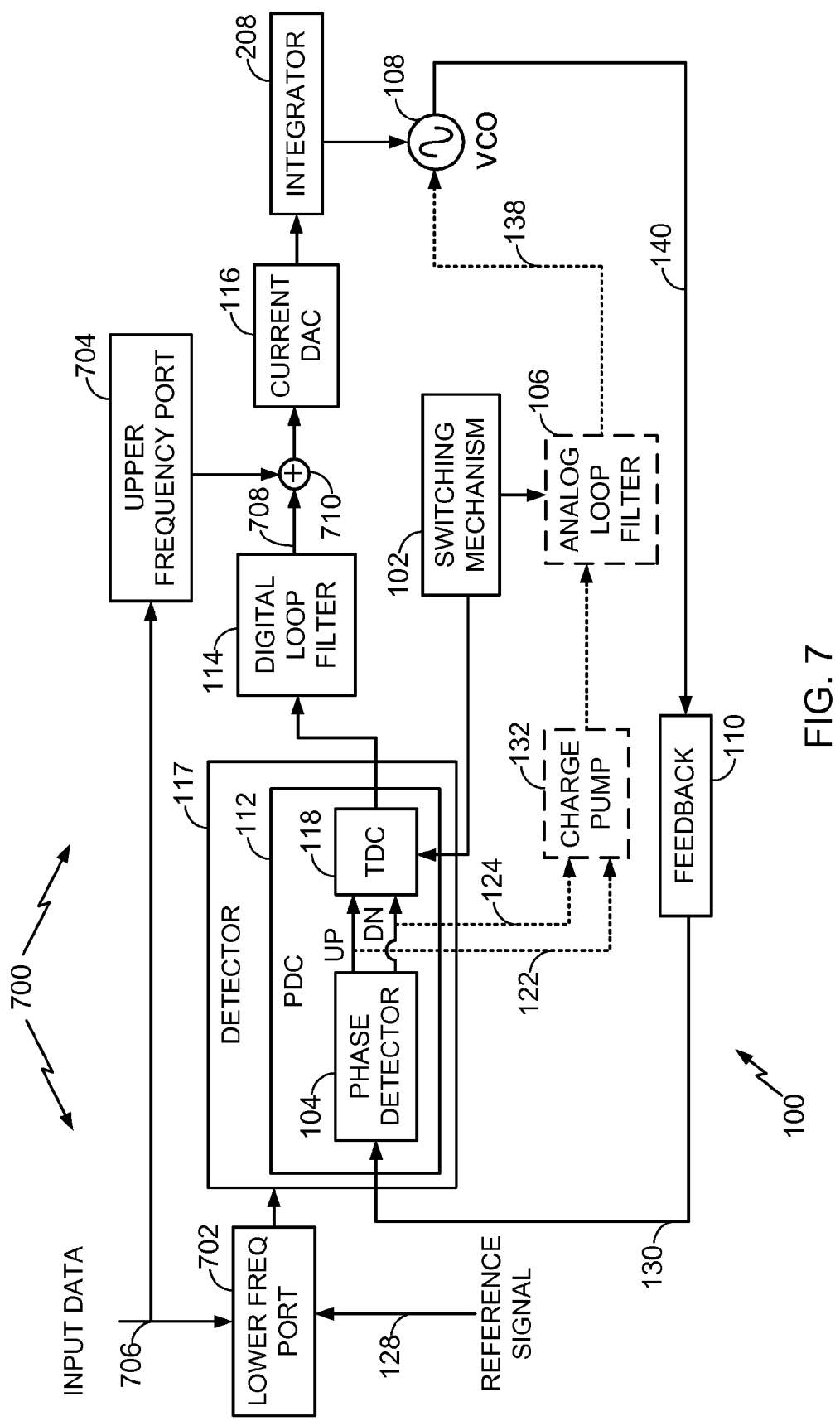
FIG. 7 is a block diagram of a dual mode PLL with two point modulation having a lower frequency port in the reference path.

FIG. 7 is a block diagram of a configurable PLL device 100 with two point modulation having a lower frequency port 702 in the reference path. The PLL device 100 is switchable between the digital mode and analog mode as described above. When in the digital mode, two point modulation can be used to modulate the VCO output signal 140. A two point modulation port 700 includes a lower frequency port 702 and an upper frequency port 704 where the lower frequency port 702 provides modulation by data signal components having lower frequencies than the frequencies of data signal components used for modulation through the upper frequency port 704. For the example of FIG. 7, the lower frequency port 702 is within the reference signal path. The data signal input data signal 706 is combined with the reference signal prior to the phase detector. The data signal 706 may be combined with the reference signal 128 using any known technique. An example of suitable technique for combining the signals includes using a mixer, or a modulator, to mix or modulate the reference signal with the data signal. Other techniques may be used to combine signals. In circumstances, the signal may be combined using a summer, for example.

The upper frequency port 704 combines the input data 706 with the digital filter output signal 708 provided by the digital loop filter 114. The two signals are combined by a summer 710 in the exemplary embodiment. The data signal 706 may be processed before injection into the lower frequency port 702 and/or the upper frequency port 704.

Figure 8:
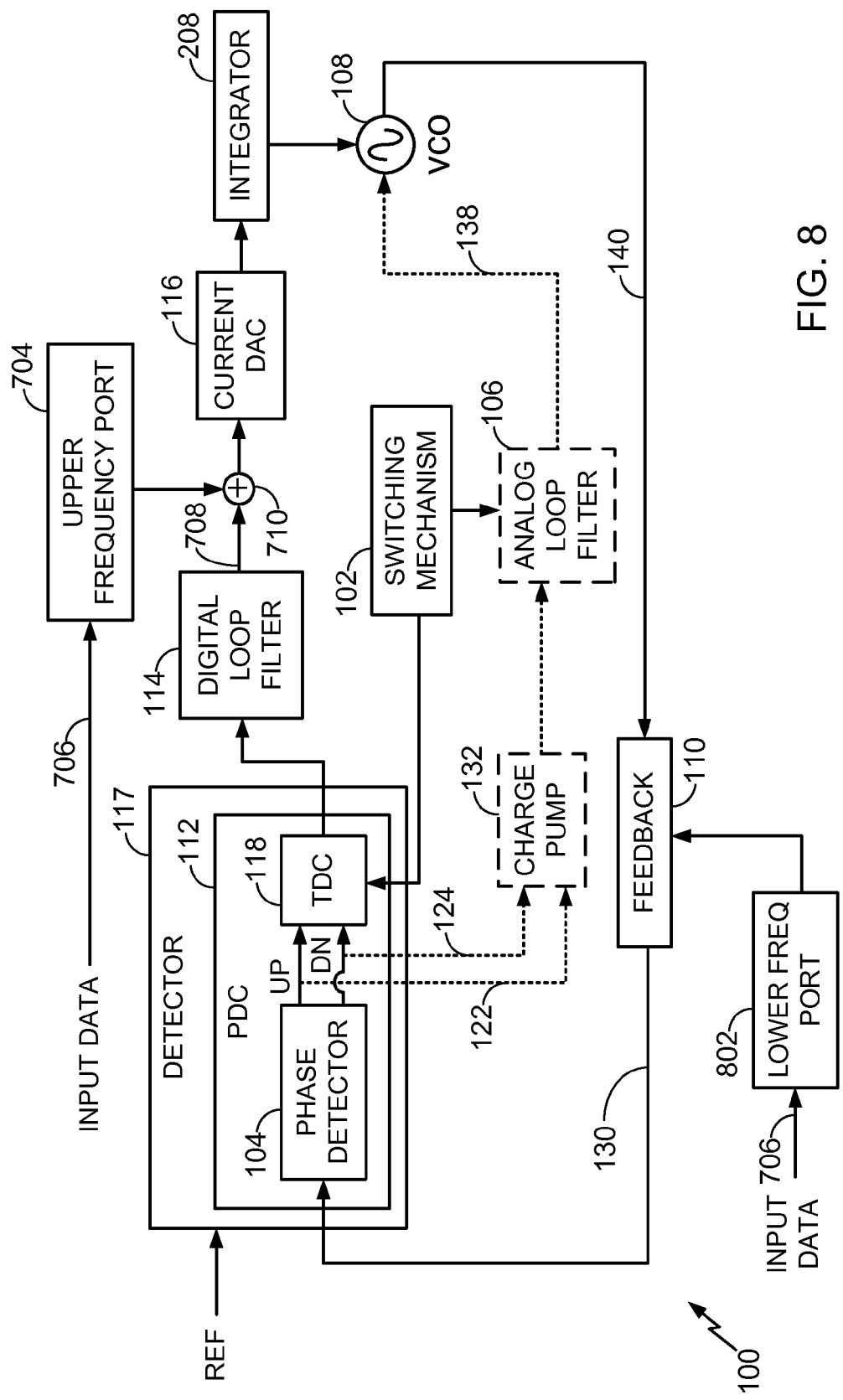
FIG. 8 is block diagram of a dual mode PLL with two point modulation having a lower frequency port in the feedback path.

FIG. 8 is block diagram of a dual mode PLL with two point modulation having a lower frequency port 802 in the feedback path. The PLL device 100 is switchable between the digital mode and analog mode as described above. When in the digital mode, two point modulation can be used to modulate the VCO output signal 140. A two point modulation port includes an upper frequency port 704 and a lower frequency port 802 where the lower frequency port 802 provides modulation by data signal components having lower frequencies than the frequencies of data signal components used for modulation through the upper frequency port 704. For the example of FIG. 8, the lower frequency port 802 is within the feedback path. The data signal 706 is used to alter the feedback signal 130. An example of suitable technique for implementing the lower frequency port 802 includes using a sigma-delta modulator. An example of such an implementation is discussed in further detail with reference to FIG. 9.

The upper frequency port 704 combines the input data 706 with the digital filter output signal 708 provided by the digital loop filter 114. The two signals are combined by a summer 710 in the exemplary embodiment. The data signal 706 may be processed before injection into the lower frequency port 802 and/or the upper frequency port 704.

Figure 9:
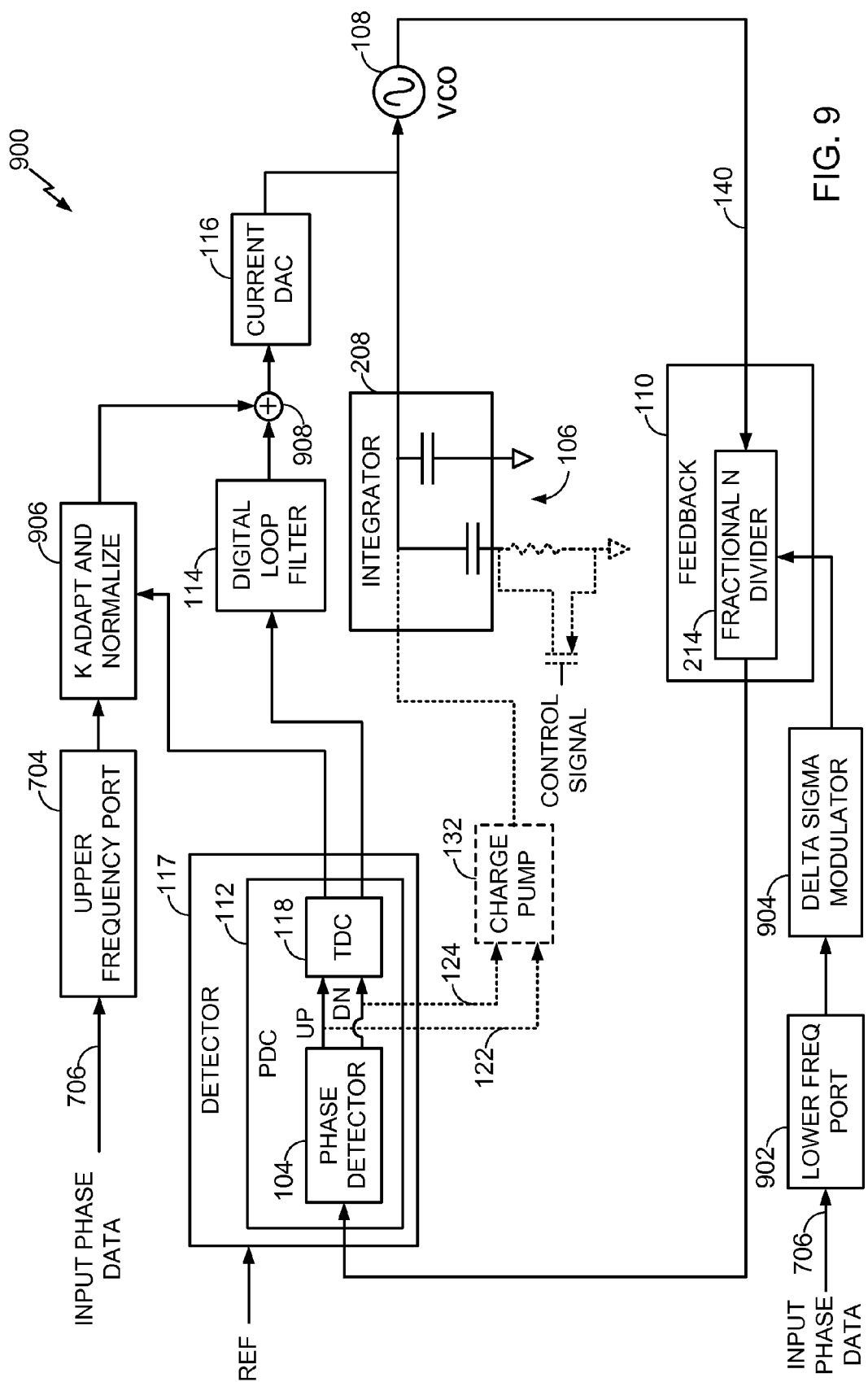
FIG. 9 is a block diagram of a dual mode PLL with two point modulation having a lower frequency port using delta signal modulation in the feedback path.

FIG. 9 is a block diagram of a PLL device 900 in accordance with the exemplary embodiment including two point modulation having a sigma delta modulation lower frequency port 902 in the feedback 110 path. The input phase data 706 is applied to two points in the PLL creating an all pass transfer function from input phase data to modulation VCO output. The lower frequency modulation port 902 is at the input of the feedback divider delta sigma modulator 904. The feedback 110 includes a fractional N divider 214. By causing the feedback division ratio to vary with the input phase data, the input phase modulation within the bandwidth of the PLL is transferred to the VCO output 140. The upper frequency modulation port 704 is applied to the gain adaptation and normalization device 906. The gain adaptation and normalization device 906 measures the phase error input to the digital loop filter 114 to estimate the variation between actual and expected analog gains of the current mode DAC 116, analog integrator 208 and VCO voltage to frequency gain and applies a scaling factor to the input phase data 706. The gain adjusted signal including the phase data combined with the output of the digital loop filter 114 in the combiner 908. This creates the high frequency modulation path which transfers input phase modulation outside the bandwidth of the PLL to the VCO output 140. In some circumstances, the input phase data applied to the gain adaptation and normalization device 906 is digitally differentiated before being summed with filter output. For example, as discussed in the related application filed concurrently with this application, digital differentiation can be included in the digital loop filter 114 to compensate for the analog integration performed by the integrator 208. In such an arrangement, the input phase data applied to the gain adaptation and normalization device 906 is digitally differentiated before being summed with the digitally differentiated digital filter output.

The upper frequency port 704 combines the input data 706 with the digital filter output signal 708 provided by the digital loop filter 114. The two signals are combined by adding in the exemplary embodiment. The data signal may be processed before injection into the lower frequency port and/or the upper frequency port.

Figure 10:
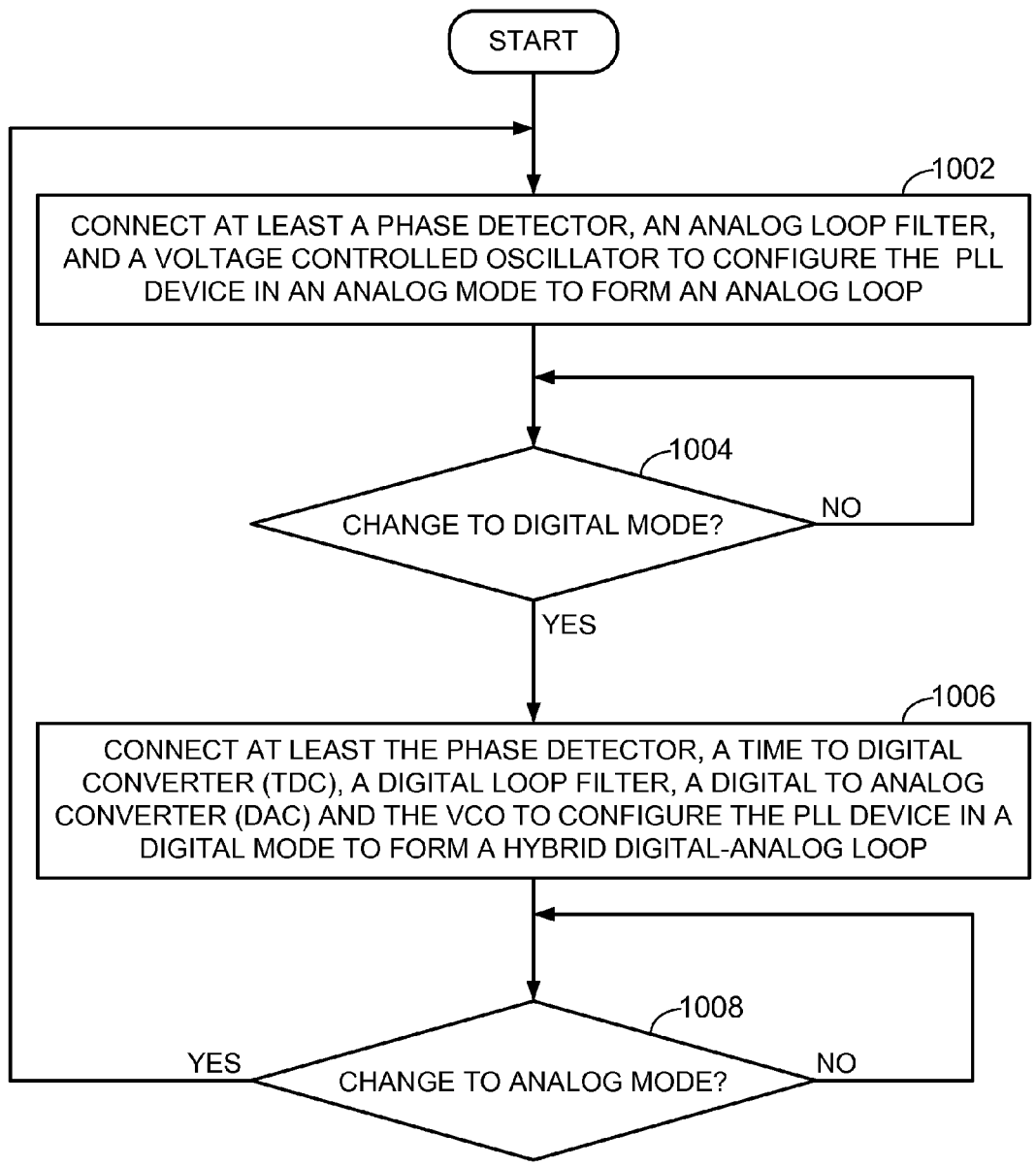
FIG. 10 is a flow chart of a method of managing a PLL device in accordance with the exemplary embodiment of the invention.

FIG. 10 is a flow chart of a method of managing a PLL device 100 in accordance with the exemplary embodiment of the invention. The method may be implemented using any combination of hardware, software, and/or firmware. In the exemplary embodiment, a controller 216 generates control signal(s) 136 to manage components of the PLL device 100.

At step 1002, at least a phase detector 104, an analog loop filter 106, and a voltage controller oscillator (VCO) 108 are connected to configure the PLL device 100 in an analog mode to form an analog loop. In the exemplary embodiment, the switching mechanism 102 connects components of the PLL device 100 to form an analog phase locked loop. The switching mechanism 102 is responsive to a control signal 136 to connect and configure the device components into the analog loop. A described above, an example of a suitable switching mechanism 102 includes a switching element 200 such as FET 300.

At step 1004, it is determined whether the PLL device 100 should be configured in the digital mode. The digital mode is selected when using a digital filter is advantageous to using analog loop filtering. In the exemplary embodiment, the digital mode is selected when the PLL is used for the transmission of signals and two point modulation is applied or when cancellation signals are injected into the two point modulation ports to reduce spurs or noise. If it is determined that the PLL device 100 should be switched to the digital mode, the method continues at step 1006. Otherwise, the method returns to step 1004 to continue monitoring the system to determine if a switch should be made.

At step 1006, at least the phase detector 104, a time to digital converter (TDC) 118, a digital loop filter 114, a digital to analog converter (DAC) 116 and the VCO 108 are connected to configure the PLL device 100 in the digital mode to form a hybrid digital-analog loop. In the exemplary embodiment, the switching mechanism 102 connects components of the PLL device 100 to form hybrid digital-analog phase locked loop where a portion of the loop operates using digital signals and a portion of the loop operates using analog signals. The switching mechanism 102 is responsive to the control signal 136 to connect and configure the device components into the hybrid digital-analog loop.

At step 1008, it is determined whether the PLL device 100 should be configured in the analog mode. The analog mode is selected when there is no advantage to using digital filtering. In the exemplary embodiment, it is determined that the PLL device 100 should be configured in the analog mode when the PLL will not be used for the transmission of signals where two point modulation is applied or when cancellation signals are injected into the two point modulation ports to reduce spurs or noise. If it is determined that the PLL device 100 should be switched to the analog mode, the method returns to step 1002. Otherwise, the method returns to step 1002 to continue monitoring the system to determine if a switch should be made.

Figure 11:
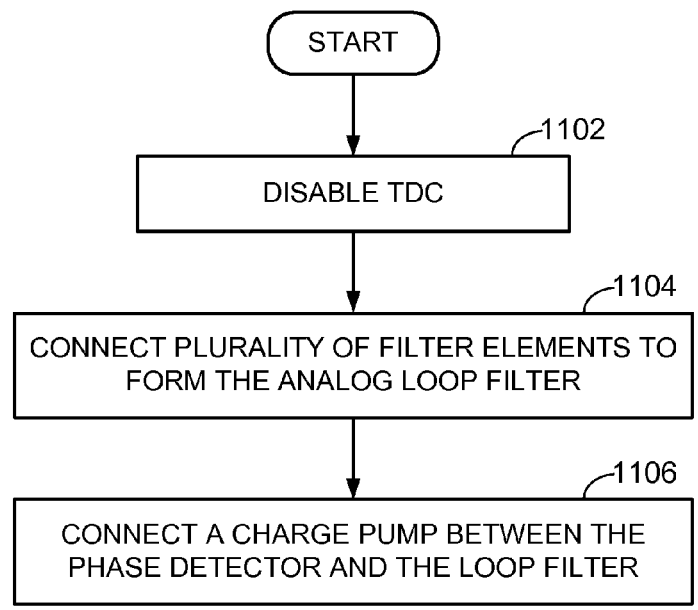
FIG. 11 is a flow chart of method of configuring the PLL device in the analog mode.

FIG. 11 is a flow chart of method of configuring the PLL device in the analog mode. Accordingly, the method discussed with reference to FIG. 11 provides an exemplary method for performing step 1002 of FIG. 10.

At step 1102, the TDC 118 is disabled. In the exemplary embodiment, the TDC 119 is turned off or is otherwise controlled to decrease or eliminate power consumption. The switching mechanism 102 may include transistors or other switching elements that connect and disconnect power to the TDC 118. Where the TDC includes switching circuitry for controlling power consumption, such circuitry can be considered to be part of the switching mechanism 102 for the discussion herein. The controller 216 provides a signal to the switching mechanism to disable the TDC 118. In the exemplary embodiment, the TDC is disabled by blocking the up and down signals from entering the TDC. An example of suitable technique includes directing the signals through a pair of AND gates or MUXes such that, in TDC enabled mode, the output of the AND or MUX is UP and DN and, in the charge pump enabled mode, the output of the AND or MUX is set to "0" such that there are no transitions on the UP and DN inputs to TDC even though the UP and DN outputs from PFD are toggling. Such an arrangement can be accomplished by switching modes when UP and DN are both low coming out of the PFD and by having TDC ring oscillator VDD be collapsed when the TDC is disabled. This will avoid putting the TDC in a state where it is consuming power due to the ring oscillator running, even though TDC is not being used.

At step 1104, the plurality of filter elements 202, 204, 206 are connected to form the analog loop filter 106. In response to the control signal 136, one or more switching elements 200 establish electrical connections between the filter elements 202, 204, 206 to form the analog loop filter 104 between the charge pump 132 and the VCO 108. In the exemplary embodiment, the FET 300 provides an open circuit across the resistor 302 to create a two pole, single zero filter.

At step 1106, the charge pump 132 is connected between the phase detector 104 and the analog loop filter 106. In response to the control signal 136, the switching mechanism 102 connects the charge pump 132. In the exemplary embodiment, the switching mechanism activates circuitry to apply a bias current to the charge pump which allows the PFD up and down signals to control the charge pump output switches that conduct current from the charge pump to the loop filter. In some circumstances, the single switching element 200 may connect multiple components to perform multiple steps of configuring the PLL device 100 in the analog loop. For example, forming the analog loop filter 106 may also result in connecting the charge pump.

Figure 12:
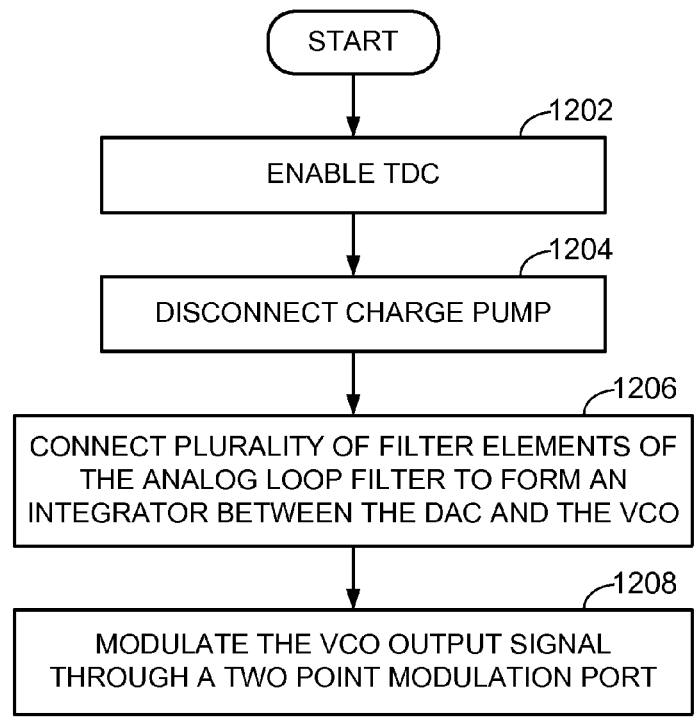
FIG. 12 is a flow chart of method of configuring the PLL device in the digital mode.

FIG. 12 is a flow chart of method of configuring the PLL device 100 in the digital mode. Steps 1202, 1204 and 1206 provide an example procedure for performing step 1006 of FIG. 10. Step 1208 is an additional step to the method discussed with reference to FIG. 10 that is performed when the PLL device 100 is configured in the hybrid digital analog loop At step 1202, the TDC 118 is enabled. In the exemplary embodiment, the TDC is enabled by allowing the up and down signals from PFD to enter the TDC.

At step 1204, the charge pump 132 is disconnected. Power is turned off during digital mode by blocking bias current from charge pump and blocking the PFD up and down signals so that charge pump output switches are always forced to off, making the charge pump output appear as a high impedance in shunt with the integrating capacitor.

At step 1206, the plurality of filter elements 202, 204, 206 are connected to form an integrator between the DAC and the VCO. In the exemplary embodiment, the FET creates a short circuit across the resistor 302 to directly connect the capacitor to ground. The two capacitors result in a parallel capacitance that forms the integrator.

At step 1208, the VCO output signal 140 is modulated through a two point modulation port. In the exemplary embodiment, the two point modulation port comprises an upper frequency port and a lower frequency port, wherein the lower frequency port is connected within the feedback path and uses sigma-delta modulation. The upper frequency port is connected between the digital loop filter and the DAC. Other two-point modulation techniques may be uses in some circumstances. For example, the lower frequency port may be connected with the reference signal path such that the data signal is combined with the reference signal.

The method steps described above with reference to FIG. 10, FIG. 11 and FIG. 12 may be performed in a different order than described. Tasks described as performed in a single step may be partially performed by other steps. Accordingly, tasks described as performed in a single step may be performed by multiple steps in some situations. Further, some steps may include several tasks that may be performed by additional steps that are not shown.

Figure 13:
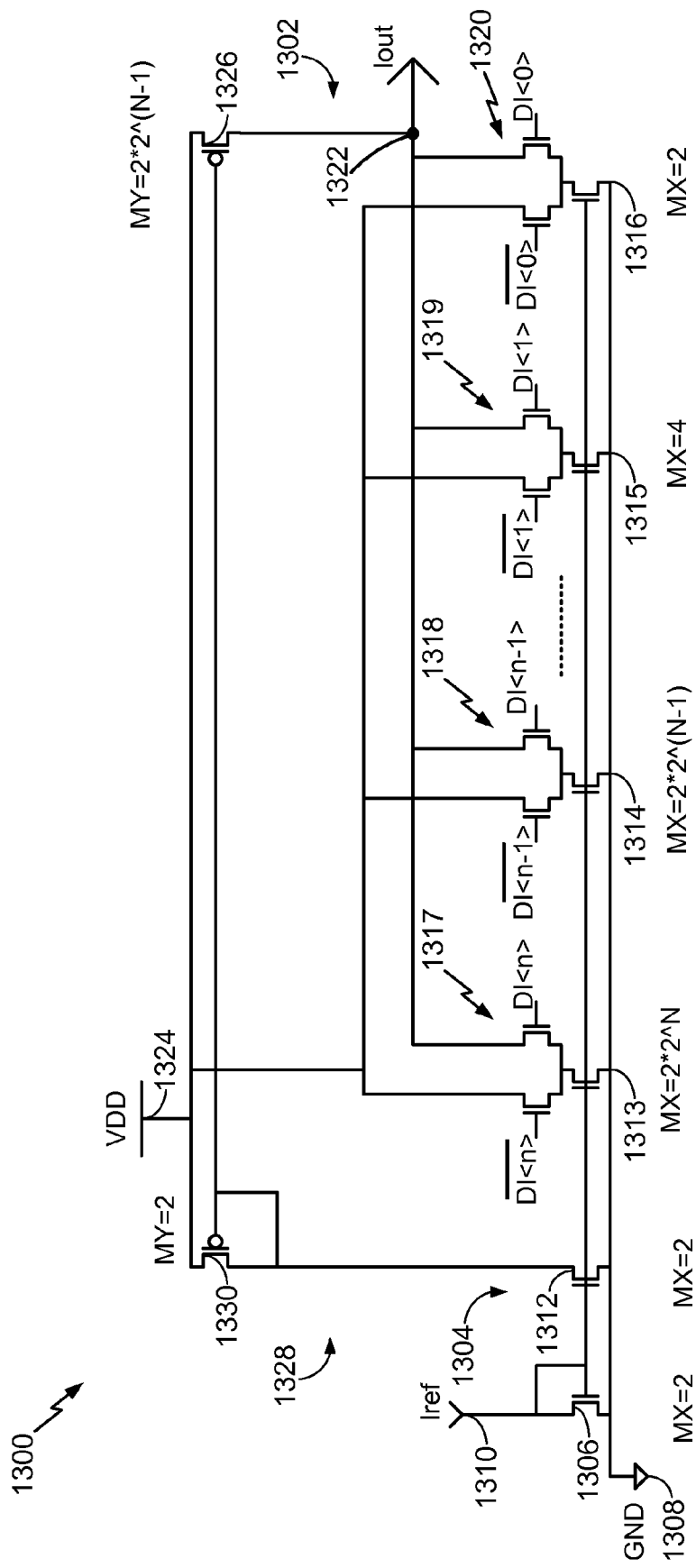
FIG. 13 is a schematic representation of a current steering DAC with a current source output stage.

FIG. 13 is a schematic representation of a current steering DAC 1300 with a current source output stage 1302. For the example, the digital input word is DI<n:0>. MY indicates the relative size between PMOS transistors and MX indicates the relative size between NMOS transistors. Iref is an input current bias. The exemplary current source output stage 1302 is implemented using active devices such as transistors. The output stage discussed with reference to FIG. 13 includes a current mirror 1304 having a reference input NMOS transistor 1306 where the source of the reference input NMOS transistor 1306 is connected to ground 1308. The drain and gate of the input reference NMOS transistor are connected to a reference current input 1310. The reference input NMOS transistor 1306 generates a reference voltage at the drain and gate nodes. The reference voltage is coupled to the gates of a plurality of NMOS transistors 1312-1316. In some situations, the plurality of NMOS transistors 1313-1316 have sources connected to ground, and drains each individually connected to the sources of NMOS differential pairs 1317-1320. One drain output of each differential pair is connected to the DAC output 1322 and the other can be connected to a dump node, such as power supply 1324. The DAC output 1322 is biased with a PMOS current source 1326 of a PMOS current mirror 1328. The PMOS current mirror includes the current source 1326 and a reference device 1330, where the current source 1326 which provides half of the maximum current that can be provided by the NMOS current sources 1312-1316 when all current sources are switched to the output 1322. By programming the gate inputs to the differential pairs, the DAC output value is set according to how many NMOS current source to differential pair outputs are programmed to switch to the DAC output 1322.

Figure 14:
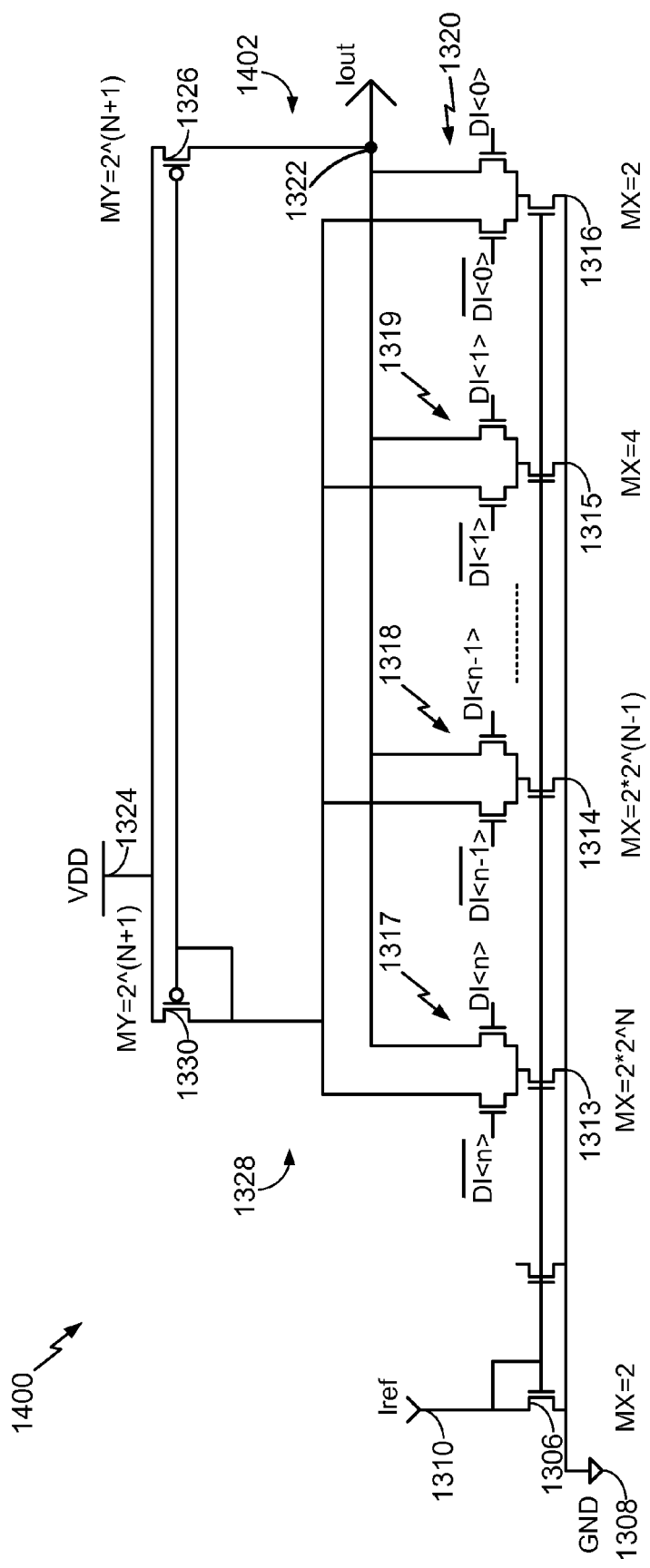
FIG. 14 is a schematic representation of a current steering DAC with a current source output stage in accordance with another configuration.

FIG. 14 is a schematic representation of a current steering DAC 1400 with a current source output stage 1402 in accordance with another configuration. For this example, one drain output of each differential pair 1317-1320 is connected directly to the DAC output 1322 and the other is connected to the reference device 1330 of the PMOS current mirror 1328. The sources of the devices of the PMOS current mirror are connected to the positive power supply 1324. The gate and drain of the reference device 1330 are both connected to the drains of the NMOS differential pair transistors which are not connected directly to the DAC output 1322. The voltage generated on the gate of the PMOS current mirror reference device 1130 is applied to the PMOS current source transistor 1326 that has a drain connected to the DAC output 1322. As a result, the DAC output 1322 can source either negative or positive currents depending on the value of the DAC digital input word.

Figure 15:
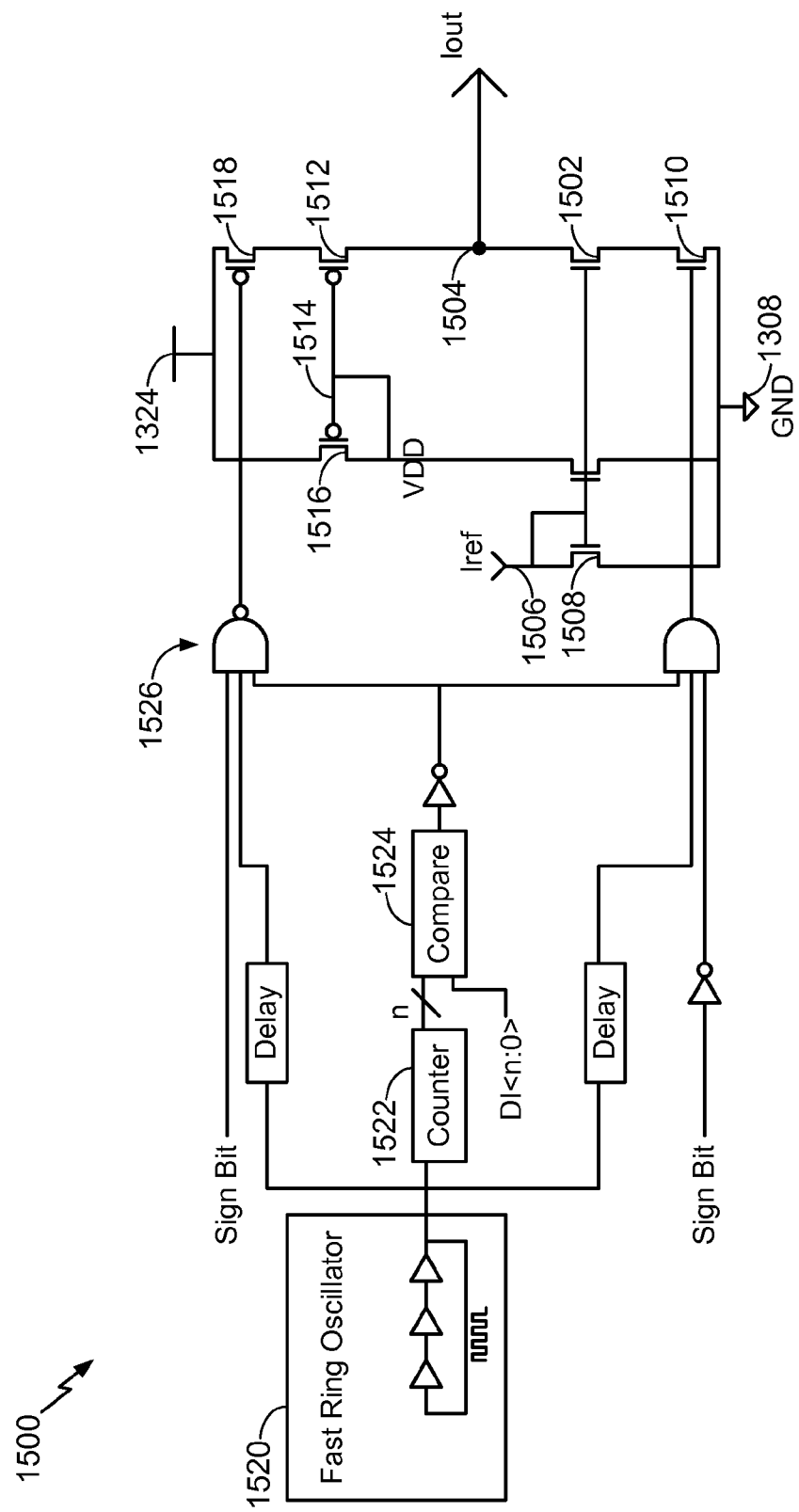
FIG. 15 is a schematic representation of exemplary current pulse DAC with a current source output stage.

FIG. 15 is a schematic representation of exemplary current pulse DAC 1500 with a current source output stage 1502. For the example, the digital input word is DI<n:0> and a sign bit to indicate if the filtered phase error is positive or negative. All transistors have the same width/length ratio.

The current source output stage 1502 is implemented as a single NMOS transistor 1502 with drain connected to the DAC output 1504, the gate connected to a reference voltage created by applying a reference current 1506 to the drain and gate of a NMOS transistor 1508 with source connected to ground 1308, and the source connected to a switch 1510 which connects to ground 1308. The DAC output value is programmed by pulsing the switch 1510 on and off a number of times equal to the DAC input word DI<n:0>. A complementary current source output stage 1512 is implemented as a single PMOS transistor 1512 with drain connected to the DAC output 1504, the gate connected to a reference voltage 1514 created by applying a copy of the NMOS reference current to the drain and gate of a PMOS transistor 1516 with source connected to the positive power supply 1324, and the source connected to a switch 1518 which connects to the positive power supply 1324. Either the NMOS 1502 or the PMOS current source 1504 is selected to be active by the sign bit of the DAC input word. If the input word is unsigned, the most significant bit of the DAC input can be used as the sign bit. A ring oscillator 1520 drives a pulse counter 1522, the output of the counter 1522 drives a digital comparator 1524 which compares the count with the DAC digital input word, or digital input word minus the most significant bit for unsigned DAC digital input words. When the count is less than the DAC digital input word, logic circuitry 1526 applies couples the ring oscillator signal to the gate control of the switch 1502, 1510 in the source of the NMOS current source transistor 1502 or PMOS current source transistor 1512 and creates one equal pulse of current for each ring oscillator period. When the count exceeds the DAC digital input word, the ring oscillator signal is blocked from the gate control of the NMOS or PMOS current source switch transistor. The counter is reset to zero once at the start of each reference period, allowing the next DAC input word to be converted to an analog current output sample. In some circumstances, a connection from the comparator output to provide an enable signal to the fast ring oscillator so that the oscillator is disabled after counting the required number of pulses. The DAC output for this example is a series of current pulses where the total number of pulses per sample is equal to the DAC input word.

An example of suitable technique for disabling the DAC during the analog mode includes disabling the bias current signal (IREF) and to setting all switches controlled by DI<n:0> as wells as the FETs 1510, 1518 to an open or high impedance state.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A phase locked loop (PLL) device comprising:
a phase detector;
an analog loop filter;
a voltage controlled oscillator (VCO);
a time to digital converter (TDC);
a digital loop filter;
a digital to analog converter (DAC); and
a switching mechanism responsive to a first control signal value to configure the PLL device into an analog loop comprising the phase detector, analog loop filter, and VCO and responsive to a second control signal value to configure the PLL device into a hybrid digital-analog loop comprising the phase detector, TDC, DAC, and VCO.

2. The PLL device of claim 1, wherein the switching mechanism disables the TDC when the PLL device is configured in the analog loop.

3. The PLL device of claim 1, wherein the TDC is connected to the output of the phase detector.

4. The PLL device of claim 1, wherein the switching mechanism is coupled to a controller external to the PLL, and
wherein at least one of the first and second control signal values is received by the switching mechanism from the controller.

5. The PLL device of claim 1, wherein the switching mechanism further configures the PLL device to stop using the TDC and DAC upon receiving the first control signal.

6. A phase locked loop (PLL) device comprising:
a phase detector means for detecting a phase difference;
an analog loop filter means for analog loop filtering;
a voltage controlled oscillator (VCO) means for generating a VCO signal;
a time to digital converter (TDC) means for converting a time period to a digital number;
a digital loop filter means for digital filtering;
a digital to analog converter (DAC) means for converting a digital signal into an analog signal; and
a switching means for configuring the PLL device in an analog loop comprising the phase detector means, analog loop filter means, and VCO means in response to a first control signal and for configuring the PLL device in a hybrid digital-analog loop comprising the phase detector means, TDC means, DAC means, and VCO means in response to a second control signal.

7. The PLL device of claim 6, wherein the switching means is for disabling the TDC means when the PLL device is configured in the analog loop.

8. The PLL device of claim 6, wherein the TDC is connected to the output of the phase detector.

9. The PLL device of claim 6, wherein the switching means is coupled to a controlling means external to the PLL, and
wherein at least one of the first and second control signals is received by the switching means from the controlling means.

10. The PLL device of claim 6, wherein the switching means further configures the PLL device to stop using the TDC and DAC upon receiving the first control signal.

11. A method for managing a phase locked loop, the method comprising:
connecting, in response to a first control signal value, at least a phase detector, an analog loop filter, and a voltage controlled oscillator (VCO) to configure the PLL device in an analog loop;
connecting, in response to a second control signal value, at least the phase detector, a time to digital converter (TDC), a digital loop filter, a digital to analog converter (DAC) and the VCO to configure the PLL device in a hybrid digital-analog loop.

12. The method of claim 11, wherein the connecting to form the analog loop comprises disabling the TDC.

13. The method of claim 11, wherein, the TDC is connected to the output of the phase detector in the hybrid digital-analog loop.

14. The method of claim 11, further comprising: receiving a control signal value from a controller external to the phase-locked loop, wherein the control signal value is either the first control signal value or the second control signal value.

15. The method of claim 11, further comprising: configuring the PLL device to stop using the TDC and DAC in response to the first control signal value.

16. A computer-readable medium encoded with computer-executable instructions, the execution of the computer-executable instructions for:
connecting, in response to a first control signal value, at least a phase detector, an analog loop filter, and a voltage controlled oscillator (VCO) to configure the PLL device in an analog loop;
connecting, in response to a second control signal value, at least the phase detector, a time to digital converter (TDC), a digital loop filter, a digital to analog converter (DAC) and the VCO to configure the PLL device in a hybrid digital-analog loop.

17. The computer-readable medium of claim 16, wherein the connecting to form the analog loop comprises disabling the TDC.

18. The method of claim 16, wherein, the TDC is connected to the output of the phase detector in the hybrid digital-analog loop.

19. The method of claim 16, wherein the execution of the computer-executable instructions further comprise: receiving a control signal value from a controller external to the phase-locked loop, wherein the control signal value is either the first control signal value or the second control signal value.

20. The method of claim 16, wherein the execution of the computer-executable instructions further comprise: configuring the PLL device to stop using the TDC and DAC in response to the first control signal value.

21. A phase locked loop (PLL) device comprising:
an analog loop comprising:
a phase detector;
a charge pump coupled to output of the phase detector;
an analog loop filter coupled to output of the charge pump; and
a voltage controlled oscillator (VCO) coupled to output of the analog loop filter;
a hybrid digital-analog loop comprising:
the phase detector;
a time to digital converter (TDC) coupled to output of the phase detector;
a digital loop filter coupled to output of the TDC;
a digital to analog converter (DAC) coupled to output of the digital loop filter; and
the VCO coupled to output of the DAC; and
a switching mechanism that configures the PLL device to use the analog loop and not the hybrid digital-analog loop in response to receiving a first control signal and configures the PLL device to use the hybrid digital-analog loop in response to receiving a second control signal.

* * * * *